(12) United States Patent
Hortschitz et al.

(10) Patent No.: US 11,231,450 B2
(45) Date of Patent: Jan. 25, 2022

(54) DEVICE FOR MEASURING AN ELECTRIC FIELD

(71) Applicant: Donau-Universitaet Krems, Krems (AT)

(72) Inventors: Wilfried Hortschitz, Poettsching (AT); Michael Stifter, Neunkirchen (AT); Harald Steiner, Flatz (AT)

(73) Assignee: Donau-Universitaet Krems, Krems (AT)

( * ) Notice: Subject to any disclaimer, the term of this patent is extended or adjusted under 35 U.S.C. 154(b) by 0 days.

(21) Appl. No.: 16/956,111

(22) PCT Filed: Nov. 16, 2018

(86) PCT No.: PCT/EP2018/081516
§ 371 (c)(1),
(2) Date: Jun. 19, 2020

(87) PCT Pub. No.: WO2019/120795
PCT Pub. Date: Jun. 27, 2019

(65) Prior Publication Data
US 2020/0355735 A1 Nov. 12, 2020

(30) Foreign Application Priority Data
Dec. 20, 2017 (AT) .............................. A 51052/2017

(51) Int. Cl.
*G01R 29/12* (2006.01)
(52) U.S. Cl.
CPC .................... *G01R 29/12* (2013.01)
(58) Field of Classification Search
CPC ...................................................... G01R 29/12
See application file for complete search history.

(56) References Cited

U.S. PATENT DOCUMENTS

| 6,835,926 B2 * | 12/2004 | Weitekamp | G01R 29/12 |
| | | | 250/225 |
| 8,339,131 B2 * | 12/2012 | Xia | G01R 29/0878 |
| | | | 324/244 |

(Continued)

FOREIGN PATENT DOCUMENTS

| DE | 102008052477 A1 | 6/2010 |
| DE | 102009029202 A1 | 3/2011 |

(Continued)

OTHER PUBLICATIONS

International Search Report in PCT/EP2018/081516, dated Jan. 31, 2019.

(Continued)

*Primary Examiner* — Walter L Lindsay, Jr.
*Assistant Examiner* — Milton Gonzalez
(74) *Attorney, Agent, or Firm* — Collard & Roe, P.C.

(57) ABSTRACT

A device for measuring an electric field includes a micromechanical structure made of a material that is electrically conductive at an operating temperature. The micromechanical structure has a frame portion and a movable portion; the movable portion is electrically conductively and mechanically elastically connected to the frame portion and can be moved relative to the frame portion; the micromechanical structure is designed so that, when the micromechanical structure is arranged in the electric field, an electrical polarization of the micromechanical structure occurs by a first field intensity component not equal to zero and is parallel to a first direction, the electrical polarization causing a first force component acting on the movable portion parallel to the first direction and a change in the spatial arrangement of the movable portion relative to the frame portion dependent on the first force component. A detector determines the change.

24 Claims, 5 Drawing Sheets

(56) References Cited

U.S. PATENT DOCUMENTS

| | | |
|---|---|---|
| 9,632,123 B2 | 4/2017 | Mueller et al. |
| 2011/0056295 A1 | 3/2011 | Classen |
| 2015/0070028 A1 | 3/2015 | Xia et al. |
| 2016/0025666 A1* | 1/2016 | Ghionea ............. G01R 29/12 |
| | | 205/775 |
| 2018/0029878 A1* | 2/2018 | Dehe ................. B81B 3/0021 |
| 2018/0092557 A1* | 4/2018 | Bickford .............. A61B 5/291 |

FOREIGN PATENT DOCUMENTS

| | | |
|---|---|---|
| DE | 10 2012 222 973 A1 | 6/2014 |
| RU | 2212678 C2 | 9/2003 |

OTHER PUBLICATIONS

Hill et al., The measurement, instrumentation, and sensors handbook XXV, section 47, Electric Field Strength (CRC Press LLC and IEEE Press, 1999), 1 page.

N.J. Vasa et al., "Development of an electric field sensor based on second harmonic generation with electro-optic materials", Journal of Materials Processing Technology 185 (2007) 173-177.

Ma et al, "A MEMS-Based Electric Field Sensor for Measurement of High-Voltage 1-19 DC Synthetic Fields in Air" IEEE Sensors Journal, IEEE Service Center, New York, NY, US, vol. 17. No. 23. Dec. 1, 2017 (Dec. 1, 2017). pp. 7866-7876.

* cited by examiner

DEVICE FOR MEASURING AN ELECTRIC FIELD

CROSS REFERENCE TO RELATED APPLICATIONS

This application is the National Stage of PCT/EP2018/081516 filed on Nov. 16, 2018, which claims priority under 35 U.S.C. § 119 of Austrian Application No. A 51052/2017 filed on Dec. 20, 2017, the disclosure of which is incorporated by reference. The international application under PCT article 21(2) was not published in English.

FIELD OF THE INVENTION

The present invention relates to a device for measurement of an electric field, especially of a static or quasi-static electric field.

PRIOR ART

The measurement of electric fields, especially of static or relatively slowly varying electric fields, plays a role in the most diverse areas. For example, the determination of electric fields at workplaces in electrostatically protected areas, such as, for example, in the manufacturing and packaging of electronic components, may be important, where surface charges must be avoided. An entirely different example is represented by the measurement of electric fields in the earth's atmosphere, which yields information important for meteorology, since changes of these electric fields are generated by meteorological phenomena, such as, for example, storms, cold/warm front passages or rain clouds. In particular, the lightning research is also to be mentioned, for which the monitoring of electrostatic fields in the atmosphere is of eminent importance, for example in order to be able to predict the occurrence of lightning.

From the prior art, especially electric-field meters for measurement of electric fields are known in which an electrically conducting sensor electrode is exposed and covered again periodically by means of a rotating impeller, so that the sensor electrode can be alternately charged and discharged by influence of the external electric field; see, for example, D. A. Hill and M. Kanda, *The measurement, instrumentation, and sensors handbook XXV, section 47, Electric Field Strength* (CRC Press LLC and IEEE Press, 1999). On the basis of the impeller, electric-field meters are frequently also known as field mills. A disadvantage of these field mills is that they must usually have relatively large dimensions and accordingly are cumbersome. Aside from that, even in field mills having relatively small dimensions, a grounding of individual parts of the respective field mills, especially of the sensor electrodes, is usually provided, which inevitably distorts the electric fields to be measured.

In contrast, electrooptical sensors known from the prior art do not need any grounding for measurement of electric fields and so, as regards possible distortions of the electric field to be measured, are superior to field mills; see, for example, N.J. Vasa et al., *Journal of Materials Processing Technology* 185 (1-3), 173 (April 2007). For example, by means of electrooptical crystals, the electric field strength can be determined on the basis of light absorption or changes of the refractive index. However, the known electrooptical sensors exhibit a strong intrinsic temperature instability, which is to be attributed to the pyroelectric effect in conjunction with the thermal expansion of the respective sensor material.

TASK OF THE INVENTION

It is therefore the task of the present invention to provide a device for measurement of an electric field, especially of an electric field that is static or that varies slowly in time, which device avoids the above-mentioned disadvantages. In particular, the device according to the invention is intended not to distort the electric field to be measured and the device according to the invention is intended to be miniaturizable as well as to be as temperature-insensitive or temperature-stable as possible.

PRESENTATION OF THE INVENTION

According to the invention, a device for measurement of an electric field is provided for accomplishment of the said task, the device comprising a micromechanical structure, which extends in a first direction, a second direction and a third direction, wherein the first direction, the second direction and the third direction are mutually normal to one another, wherein the micromechanical structure is made from a material that is electrically conducting at an operating temperature and has a frame portion as well as a movable portion, wherein the movable portion is connected in electrically conducting and mechanically elastic manner with the frame portion and is movable relative to the frame portion, wherein the micromechanical structure is so designed that, in the case of an arrangement of the micromechanical structure in the electric field with a non-zero first field-strength component parallel to the first direction, an electrical polarization of the micromechanical structure takes place, which results in a first force component acting on the movable portion parallel to the first direction as well as a change, dependent on the first force component, of the spatial arrangement of the movable portion relative to the frame portion, and wherein detecting means are provided in order to determine the change of the spatial arrangement of the movable portion relative to the frame portion.

With this device, it is possible in particular to determine static electric fields (i.e. with the frequency 0 Hz) or quasi-static electric fields (frequency typically in the range of 100 Hz or lower), wherein the maximum frequency of the still detectable electric fields is dictated by the mechanical properties of the micromechanical structure, especially by its natural or resonance frequencies.

A distortion of the electric field to be measured is practically excluded by the device according to the invention, especially since the device according to the invention can be constructed extremely compactly (by virtue of the small dimensions the electric field is practically not distorted) and since no grounding of any kind is needed.

The thermal dependence of the mechanical properties of the micromechanical structure is well-defined and known, and so on the one hand a systematic well-defined temperature dependence exists and thus can easily be taken into consideration mathematically. On the other hand, the temperature dependence can also be reduced still further by selection of suitable material and an optimized geometry, for which reason the device according to the invention is to be characterized as temperature-insensitive or temperature-stable, especially in comparison with the known prior art.

The micromechanical structure could also be referred to as a sensor, which is read with the detecting means.

Typically, the dimensions of the micromechanical structure in the first and second direction lie in the range of 0.1 mm to 5 mm, preferably of 0.1 mm to 1 mm, and in the third direction are typically at least one order of magnitude smaller. Typically, the above-mentioned maximum frequency of still detectable electric fields then lies correspondingly in the range of 10 kHz. Within the scope of the present Application, however, the term "micromechanical structure" is to be understood to the effect that even dimensions in the submicron range are theoretically possible, especially in the third direction. Therefore, not only is the device according to the invention greatly miniaturizable, but also the said maximum frequency can even be raised well above the said 10 kHz.

The operating temperature refers to that temperature at which the device is typically used. The operating temperature is usually much higher than the absolute zero, and so typically semiconductor materials also come into question for the micromechanical structure, since they are sufficiently conductive at the operating temperature. The latter means that, at the operating temperature, the micromechanical structure is very rapidly polarizable by electrical influence, since the charge carriers are able to migrate in the material of the micromechanical structure.

The electrically conducting connection between the frame portion and the movable portion ensures that actually the micromechanical structure is polarized as a whole and that the frame portion and the movable portion are not polarized separately.

The mechanically elastic connection between the frame portion and the movable portion ensures that the movable portion is able to move relative to the frame portion in the presence of an electric field and to assume its original spatial arrangement relative to the frame portion once again when the electric field is no longer present. In other words, the mechanically elastic connection is synonymous with a connection by means of spring elements or resilient elements. Such connections are known in themselves. They may be realized in particular by selection of suitable material for the connection between the movable portion and the frame portion.

Preferably, the movable portion is movable at least parallel to the first direction. In this case, if an electric field in the first direction or the first field-strength component is non-zero, it can cause or generate a first force component and consequently a deflection or change of arrangement of the movable portion relative to the frame portion parallel to the first direction. The deflection or magnitude of the change of arrangement, which is determined by way of the detecting means, is then correspondingly a measure of the electric field strength in the first direction or of the first field-strength component.

Obviously a control unit may also be provided in the device according to the invention, in order immediately to undertake a "conversion" between the determined change of arrangement and the magnitude of the electric field in the first direction or of the first field-strength component.

A complete spatial resolution, i.e. in all three spatial directions, of an arbitrarily oriented electric field can be realized correspondingly, for example by combining three devices according to the invention as follows: The movable portion of the first device can be moved selectively only in the first direction, the movable portion of the second device only in the second direction and the movable portion of the third device only in the third direction. "Only" is to be understood here to the effect that, in principle, movements of the respective movable portion in the other two directions certainly cannot be excluded but are at least one order of magnitude smaller, when an equally large field-strength component is present in those directions. In other words, the mechanically elastic connection is such that, at least approximately, a spring constant exists in one of the three directions that is at least one order of magnitude smaller than the spring constants in the remaining two directions.

In the simplest case, merely three identical devices are combined in such a way that the first device is oriented along the first direction, the second device along the second direction and the third device along the third direction.

By analogy with the foregoing description, a control unit may be provided, which immediately converts the changes of arrangement determined for all three directions into the magnitudes of the electric fields in all three directions or into the magnitudes of the first field-strength component, of a second field-strength component and of a third field-strength component.

In order to be able to manufacture the micromechanical structure, especially with the resilient elements between the movable portion and the frame portion in well-defined manner with desired mechanical properties, the frame portion and the movable portion, especially the entire micromechanical structure, may be constructed in one piece. In the process, the frame portion and the movable portion, especially the entire micromechanical structure, may preferably be made of single-crystal silicon. As an example, this permits the manufacture on the basis of a silicon wafer or silicon-on-insulator (SOI) wafer in a manner known in itself. Hereby, moreover, an inexpensive large-scale manufacturing process is possible.

In order to ensure a simple construction, it is provided in a preferred embodiment of the device according to the invention that the frame portion is formed at least partially with substantially a U-shape in a plane that is parallel to the first direction and the second direction, wherein parallel limbs of the U-shape extend parallel to the first direction, that the movable portion is disposed between the limbs and that the movable portion is connected with the limbs via webs, which preferably extend parallel to the second direction.

These webs may extend in U-shaped or meandering manner in the plane, in order to avoid mechanical nonlinearities in case of larger deflections/changes of arrangement.

In particular, it is possible with this construction to achieve a specific sensitivity of the device according to the invention in the first direction, since the movable portion is able to move mechanically more easily and possibly also further in the first direction than in the other two directions. In this case, the webs ensure a spring constant in the first direction that is at least one order of magnitude smaller than corresponding spring constants in the other two directions.

As already stated above, three identical such devices can be combined, in order to permit a spatially complete resolution of the electric field to be measured.

In order to increase the sensitivity or the resolving power, it is provided in a preferred embodiment of the device according to the invention that the micromechanical structure comprises an amplifying element that is electrically separate from the frame portion and from the movable portion and that, viewed in the first direction, is disposed behind the movable portion, wherein a gap is disposed between the movable portion and the amplifying element. The amplifying element is likewise polarized, but the charge carriers would not be able to drain from the amplifying element to the frame portion or even to the movable portion. Therefore, in the region of the gap, the movable portion has a polarization exactly opposite to that of the amplifying element in the region of the gap. Correspondingly, the movable portion is strongly attracted toward the amplifying element or the amplifying element causes an amplification of the first force component, especially in that spatial region where the gap has a particularly small gap width, wherein the latter is measured in the first direction.

In order to optimize the amplification, it is provided in a particularly preferred embodiment of the device according to the invention that the gap has a gap width, measured in the first direction, of smaller than or equal to 500 µm, preferably of smaller than or equal to 200 µm, particularly preferably of 0.1 µm to 50 µm. The latter simultaneously ensures an uncomplicated manufacturing process. For comparison: the detected deflections/changes of arrangement that are generated by an electric field are typically smaller than 1 µm.

In this way, it is possible in principle to attain a resolution in the range of 1 $(V/m)/(Hz)^{0.5}$ to 50 $(V/m)/(Hz)^{0.5}$.

Theoretically, the most diverse detecting means are conceivable, for example capacitive or acoustic. In order to exclude a distortion of the electric field to be measured by the detection of the change of arrangement or by the detecting means and simultaneously to ensure a greatest possible accuracy of the detection, it is provided in a particularly preferred embodiment of the device according to the invention that the detecting means comprise an optical sensor as well as at least one light-supplying means, in order to permit a purely optical detection.

Theoretically, it would be conceivable to see the movable portion "directly" with the optical sensor, provided this portion is large enough or the sensor is capable of sufficiently fine local resolution.

Suitable optical sensors are known in themselves. For example, an optical sensor on the basis of at least one photodiode or of at least one phototransistor would be conceivable. This at least one photodiode/at least one phototransistor may be illuminated "directly", by disposing it in spatial proximity to the movable portion, especially directly under the movable portion, and directly capturing the light arriving from the region of the movable portion. Or the at least one photodiode/at least one phototransistor is illuminated "indirectly", in that the optical sensor comprises at least one light-guiding means, especially at least one glass-fiber cable, in order to guide the light from the region of the movable portion, especially from the region directly under the movable portion, to the at least one photodiode/to the at least one phototransistor.

The at least one light-supplying means is provided in order to ensure a defined illumination of the movable portion. As an example, the at least one light-supplying means may comprise one or more light guides and/or at least one light source, especially one or more light-emitting diodes.

The micromechanical structure does not necessarily have to be disposed between the at least one light-supplying means and the optical sensor. For example, a measurement in reflection geometry would also be theoretically conceivable, in which the at least one light-supplying means and the optical sensor are disposed on the same side relative to the micromechanical structure.

In a particularly preferred embodiment of the device according to the invention, it is provided that the movable portion is disposed between the at least one light-supplying means and the optical sensor. This represents an embodiment that is constructively particularly simple and makes it possible, for determination of the deflection/change of arrangement of the movable portion, to use a light modulation modified hereby and/or a transmission modified hereby.

A design that is constructively particularly simple and compact is obtained by disposing the movable portion between at least one light-emitting diode and at least one photodiode or at least one phototransistor. However, since these elements must be supplied with current, situations may arise where the operation of these elements close to the movable portion would influence the weak electric field to be measured too strongly and falsify the measured result too strongly. Therefore it is provided in a particularly preferred embodiment of the device according to the invention that the at least one light-supplying means comprises a light guide, in order to illuminate one side of the micromechanical structure at least partially with light guided by the light guide, and that the optical sensor comprises a further light guide, in order to capture the light on an opposite side of the micromechanical sensor.

In order to achieve a particularly high accuracy in the detection of the deflection/change of arrangement of the movable portion, it is provided in a preferred embodiment of the device according to the invention that the detecting means comprise an aperture structure on the movable portion as well as a fixed aperture structure, wherein the fixed aperture structure has a fixed spatial arrangement relative to the frame portion. Due to the fixed aperture structure, which is disposed above—or else even below—the aperture structure on the movable portion, incident light is spatially modulated before it arrives at the movable portion. In principle, an evaluation of the light modulation measured in spatially resolved manner or its change may be made for determination of the deflection/change of arrangement of the movable portion.

In that the aperture structure on the movable portion is selected and disposed to correspond to the fixed aperture structure, this aperture structure is moved together with the movable portion and slight deflections/changes of arrangement of the movable portion can be manifested in large changes of the transmitted light intensity. In other words, the deflection/change of arrangement can be obtained highly accurately and at the same time inexpensively by a simple measurement of the transmitted light intensity, for which purpose one simple, non spatially resolving photodiode/phototransistor, for example, is sufficient.

In order to be able to manufacture the fixed aperture structure with particularly simple manufacturing technology, it is provided in a preferred embodiment of the device according to the invention that the fixed aperture structure is formed in a metal layer on a glass wafer. In other words, the metal layer forms the fixed aperture structure on the glass wafer, which is disposed above the movable portion and in spatially fixed manner relative to the frame portion. For example, the glass wafer may be rigidly connected mechanically with the frame portion.

In this way, a matching of the fixed aperture structure with the aperture structure on the movable portion can be undertaken very easily in terms of manufacturing technology.

For example, the aperture structure on the movable portion may consist of a multiplicity of rectangular holes, which are disposed in series along the first direction, wherein each hole has a smaller extent along the first direction than along the second direction. The corresponding fixed aperture structure may then likewise consist, for example, of identically large and identically disposed rectangular holes in the metal layer. Or the corresponding fixed aperture structure consists, for example, of rectangular metal strips, which are just as large as the rectangular holes and are disposed in just the same way as them, so that, at a given deflection of the movable portion, they are coincident with the holes of the aperture structure on the movable portion and practically no light is transmitted. At different deflections, in contrast, light is transmitted in varying intensity through the fixed aperture structure and the aperture structure on the movable portion.

A suitable metal would be, for example, Cr, which can be applied on the glass wafer by means of photolithography and physical gas-phase deposition ("physical vapor deposition").

Corresponding to the foregoing description, it is provided in a particularly preferred embodiment of the device according to the invention that the fixed aperture structure is disposed between the movable portion, especially the aperture structure on the movable portion, and the at least one light-supplying means or the optical sensor. A very compact construction of the device according to the invention is made possible hereby.

If the device according to the invention is exposed to mechanical vibrations, the danger exists that a deflection/change of arrangement of the movable portion will occur that is not due to the presence of an electric field. Or the danger then exists that the measured result concerning an existing electric field will be correspondingly falsified. In order to be able to separate or distinguish deflections/changes of arrangement of the movable portion generated by vibrations from such generated by electric fields, it is provided in a preferred embodiment of the device according to the invention that the micromechanical structure is so designed that the change of the spatial arrangement of the movable portion relative to the frame portion comprises a rotation of the movable portion relative to the frame portion, preferably around an axis of rotation parallel to the third direction. This takes into account the circumstance that vibrations usually act translationally and correspondingly result merely in linear deflections/changes of arrangement of the movable portion. In that the rotary component of the deflections/changes of arrangement is determined selectively, it is therefore possible to deduce the electric field directly.

The corresponding design may be based on a suitable, especially asymmetric mechanically elastic attachment of the movable portion on the frame portion.

Furthermore, the rotary effect of the electric field may be amplified by a selective geometric configuration of the amplifying element.

Alternatively or in addition to this, it is provided in a preferred embodiment of the device according to the invention, for distinction of deflections/changes of arrangement of the movable portion that are generated by vibrations from such that are generated by electric fields, that the micromechanical structure comprises a further movable portion, which is connected in electrically conducting and mechanically elastic manner with the frame portion, wherein the strength of the mechanical coupling of the further movable portion to the frame portion is in a given known ratio, preferably in 1:1 ratio, to the strength of the mechanical coupling of the movable portion to the frame portion, and wherein the micromechanical structure is so designed that, in the case of an arrangement of the micromechanical structure in the electric field with the non-zero first field-strength component, the electrical polarization of the micromechanical structure takes place, which results in a further first force component acting on the further movable portion parallel to the first direction as well as a change, dependent on the further first force component, of the spatial arrangement of the further movable portion relative to the frame portion, wherein the further first force component and/or the change of the spatial arrangement of the further movable portion is smaller by a factor smaller than or equal to 0.1, preferably smaller than or equal to 0.01, than the first force component and/or the change of the spatial arrangement of the movable portion generated by the first force component, and that further detecting means are provided in order to determine the change of the spatial arrangement of the further movable portion relative to the frame portion.

The vibrations act identically on the movable portion and on the further movable portion. However, the electric field acts by at least one order of magnitude more strongly on the movable portion than on the further movable portion. In that the deflection/change of arrangement of the further movable portion is subtracted—if necessary by application of a suitable proportionality factor, which takes into account the ratio of the mechanical couplings—from that of the movable portion, substantially that deflection/change of arrangement of the movable portion is obtained which is to be attributed mainly to the electric field.

As regards manufacturing technology, this alternative embodiment can be easily realized by reproducing the further movable portion and its attachment to the frame portion in exactly the same way as the movable portion and its attachment to the frame portion. In this way the proportionality factor may be assumed to be exactly 1, corresponding to the 1:1 ratio of the mechanical couplings. If this further movable portion is disposed spatially centrally in the frame portion and the movable portion is at the periphery of the frame portion, a larger force component generated by the electrical polarization necessarily acts on the movable portion than on the further movable portion. Moreover, this difference can be further significantly amplified by disposing the amplifying element in immediate proximity to the movable portion (separated from it only by the gap).

The detection of the deflection/change of arrangement of the further movable portion may take place in exactly the same way as for the movable portion, and so a detailed description is not necessary at this place and instead reference may be made to the corresponding detailed explanations provided above in connection with the movable portion. In other words, the description concerning the detecting means is applicable by analogy for the further detection mans. Correspondingly, it is provided in a particularly preferred embodiment of the device according to the invention that the further detecting means comprise a further aperture structure on the further movable portion as well as a further fixed aperture structure, wherein the further fixed aperture structure has a fixed spatial arrangement relative to the frame portion. Thus the further aperture structure is moved together with the further movable portion. The further fixed aperture structure may be matched specially to the further aperture structure, in order to permit a high accuracy of the determination of the deflection/change of arrangement of the further movable portion, especially by simple light-transmission measurements. Preferably, therefore, the further fixed aperture structure is disposed above the further aperture structure.

Likewise, it is provided in a particularly preferred embodiment of the device according to the invention that the further detecting means comprise a further optical sensor as well as at least one further light-supplying means. Once again, the above description concerning at least one light-supplying means as well as concerning the optical sensor is applicable by analogy.

Furthermore, it is provided in a particularly preferred embodiment of the device according to the invention that the further optical sensor is formed by the optical sensor and the at least one further light-supplying means is formed by the at least one light-supplying means, wherein the further movable portion is disposed between the at least one light-supplying means and the optical sensor. In particular, therefore, the further movable portion may be illuminated with the same light-emitting diode as the movable portion. Once again, the optical sensor needs merely a rough spatial resolution, such as two large pixels, in order to be able to distinguish between the light intensity transmitted by the movable portion and the light intensity transmitted by the further movable portion.

The further fixed movable portion can be realized particularly simply by manufacturing or disposing it together with the fixed aperture structure on the glass wafer. Correspondingly, it is provided in a particularly preferred embodiment of the device according to the invention that the further fixed aperture structure is formed in the metal layer on the glass wafer. In other words, the further fixed aperture structure is also formed by the metal layer. The glass wafer is also disposed above the further movable portion and is disposed in spatially fixed manner relative to the frame portion The field of use of the device according to the invention is manifold. In particular, a vehicle, preferably aircraft, particularly preferably unmanned aircraft comprising a device according to the invention is provided according to the invention. For example, the vehicle may be a drone, especially flying drone. Even for all other kinds of vehicles, however, the device according to the invention may be practical in order to give the person or computer steering the vehicle information about the electric field surrounding the vehicle, so that the person/computer is able to steer the vehicle in dependence on this. As an example, this ensures that an excessively high electric field (generated, for example, by a power line) does not come too close to the vehicle and thus that a damage to the vehicle is avoided. For example, in this way a flying drone is able to detect a 220-kV power line (with alternating current frequency of 50 Hz) contactlessly at a distance of approximately 70 m and to maintain an appropriate safety distance.

A multiplicity of further examples of application can be found in the area of industrial safety. According to the invention, a safety helmet comprising a device according to the invention is provided for warning a worker about live components. This device according to the invention may be integrated in fixed manner in the safety helmet.

It would also be conceivable, however, for the device according to the invention to be set up for mounting on a helmet, in order to create the safety helmet according to the invention by means of a conventional helmet in simple manner. This has the advantage in principle that any arbitrary helmet may be used and that the helmet may also be exchanged as needed.

For example, for this purpose the micromechanical structure may be disposed in a sensor module. The sensor module may be adapted to the shape of the helmet, so that, for example, it can be disposed on the helmet in a manner interlocked with a portion thereof. In particular, the said portion may be disposed frontally on the helmet, i.e. in a region located close to the forehead of the user during wearing of the helmet. The sensor module may be connected via a band, especially of elastic type, with an optoelectronic module, so that the sensor module together with the optoelectronic module and the band can be folded or stretched over the helmet, in order to be fastened to the helmet. This band may be provided with light-supplying means and light-guiding means, for example in the form of at least one glass fiber. Herewith light generated in the optoelectronic module (for example, by means of a light-emitting or laser diode) may be supplied to the micromechanical structure on one side. Furthermore, the light-guiding means may be part of an optical sensor and capture light on the opposite side of the micromechanical structure and, for example, it may supply a photodiode of the optical sensor, which is disposed in the optoelectronic module. The optoelectronic module typically has a corresponding evaluating electronic unit, in order to evaluate the sensor data. Upon detection of an electric field that may be hazardous for the worker or user, the optoelectronic module is able to emit optical and/or acoustic warning signals, in order to warn the worker or user.

According to the invention, a protective glove comprising a device according to the invention is provided by analogy for warning a worker about live components.

According to the invention, a protective boot comprising a device according to the invention is provided by analogy for warning a worker about live components.

According to the invention, a protective garment comprising a device according to the invention is provided by analogy for warning a worker about live components. The protective garment may be, for example, a jacket, a vest or a pair of pants.

In the case of the protective glove or protective boot according to the invention or of the protective garment according to the invention, the sensor module, the light-supplying means and light-guiding means as well as the optoelectronic module may be integrated in a single component, which may be fastened in space-saving manner on a conventional glove or boot or a conventional garment, in order to create the protective glove or protective boot according to the invention or the protective garment according to the invention.

Further possibilities for application of the device according to the invention exist, for example, for warning about critical electric field strengths in ESD protection (ESD: "electrostatic discharge"), especially for protection of electronic components and/or for protection from dust and gas explosions.

Obviously the device according to the invention quite generally permits contactless, non-contact potential or voltage measurements.

In particular, field measurements in the atmosphere may be undertaken by means of the device according to the invention, for example in storm clouds for weather forecasts. This goes hand-in-hand with the enablement of a hazard estimate, which, for example, makes the use for airports particularly interesting.

BRIEF DESCRIPTION OF THE FIGURES

The invention will now be explained in more detail on the basis of exemplary embodiments. The drawings are exemplary and, although they are certainly intended to explain the idea of the invention, they are in no case intended to restrict it or even describe it conclusively.

Therein.

WAYS OF WORKING THE INVENTION

Figure 1:
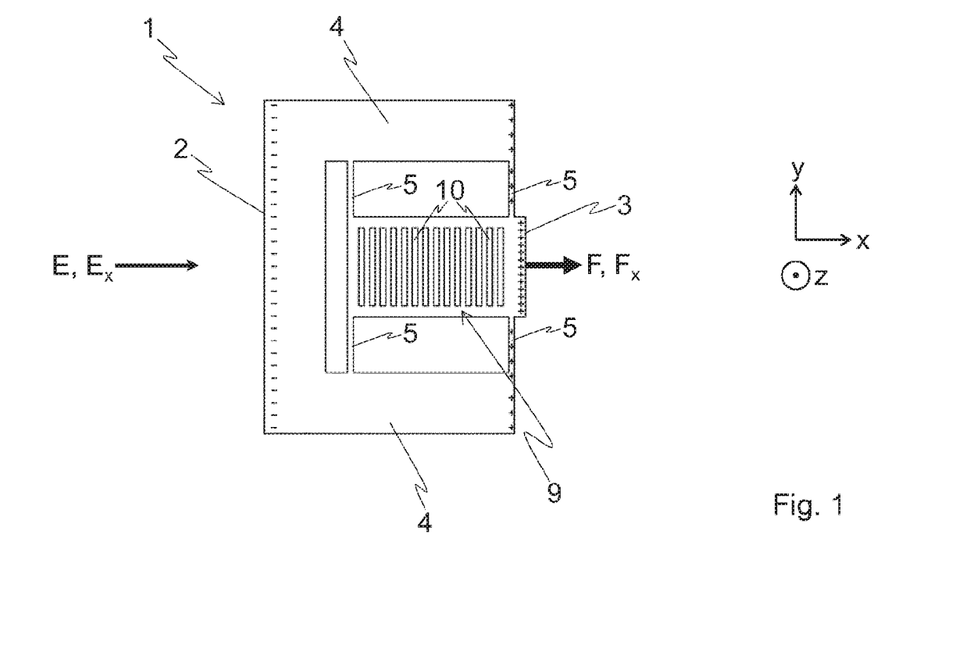
FIG. 1 shows a micromechanical structure of a first embodiment of the device according to the invention in overhead view

FIG. 1 shows a micromechanical structure 1 of a first embodiment of the device according to the invention for measurement of an electric field E. The micromechanical structure 1 extends in a first direction x, a second direction y and a third direction z, wherein the first direction x, the second direction y and the third direction z are mutually normal to one another. In the overhead view of FIG. 1, the micromechanical structure 1 is illustrated in a plane xy, which is parallel to the directions x, y, in which plane xy the micromechanical structure 1 has dimensions that typically lie in the range of 0.1 mm to 5 mm, preferably of 0.1 mm to 1 mm, and are an order of magnitude larger than in the third direction z.

In all examples shown in FIGS. 1 to 11, the micromechanical structure 1 is made from Si and preferably is manufactured on the basis of a silicon-on-insulator (SOI) wafer, which is known in itself. In other words, the micromechanical structure 1 consists of a material that is conductive at an operating temperature that typically lies well above the absolute zero. In particular, the Si may be appropriately doped to adjust the conductivity selectively for given application situations or operating temperatures.

In the exemplary embodiment of FIG. 1, the micromechanical structure 1 has a frame portion 2 and a movable portion 3, wherein the movable portion 3 is connected in electrically conducting and mechanically elastic manner with the frame portion 2 and is movable relative to the frame portion 2. Specifically, this frame portion 2 is constructed in U-shaped manner in the plane shown in FIG. 1, wherein two parallel limbs 4 of the U-shape extend parallel to the first direction x. The movable portion 3 is disposed between these limbs 4 and is connected with the limbs 4 via webs 5, which extend substantially parallel to the second direction y. Thus the frame portion 2 and the movable portion 3 are constructed in one piece. In the illustrated example of FIG. 1, four webs 5 are provided, which are disposed in the region of the four corners of the movable portion 3, wherein the movable portion has substantially a rectangular outline in the plane xy with a larger extent in the first direction x than in the second direction y. In the first direction x, the movable portion 3 projects beyond the frame portion 2.

Due to the design of the webs 5, the mechanical coupling of the movable portion 3 to the frame portion 2 can be influenced selectively. The webs 5 are able to extend in U-shaped or meandering manner (not illustrated), especially in the plane xy, in order to avoid mechanical nonlinearities in case of larger deflections/changes of arrangement of the movable portion 3 parallel to the first direction x.

The micromechanical structure 1 is so designed that, in the case of an arrangement of the micromechanical structure 1 in the electric field E with a non-zero first field-strength component $E_x$ parallel to the first direction x, an electrical polarization of the micromechanical structure 1 takes place, which in FIG. 1 is indicated by "+" and "−" on the micromechanical structure 1. In FIG. 1, only the first field-strength component $E_x$ is indicated, or the case is illustrated in which field-strength components in the directions y, z are zero.

The polarization results in a force F acting on the movable portion 3, with a non-zero first force component $F_x$ parallel to the first direction x. In the shown example, force components in the directions y, z are zero.

Due to the first force component $F_x$, a change (not illustrated) of the spatial arrangement of the movable portion 3 relative to the frame portion 2 takes place in dependence on its magnitude. In the shown example, this change would be a deflection of the movable portion 3 along the first direction x, pointing away from the frame portion 2.

Figure 2:
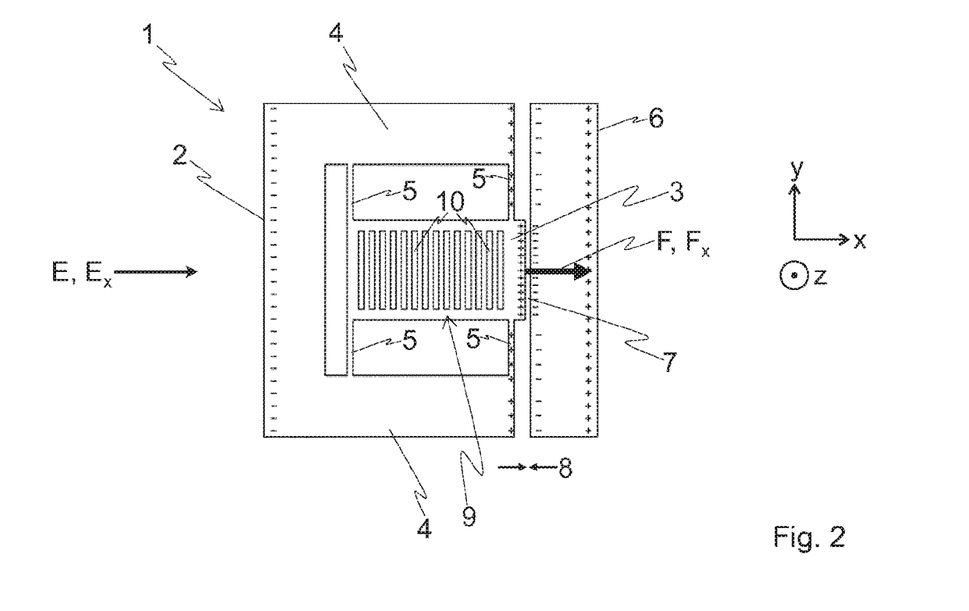
FIG. 2 shows the micromechanical structure of a second embodiment of the device according to the invention in overhead view, wherein an amplifying element is provided by comparison with the first embodiment
Figure 3:
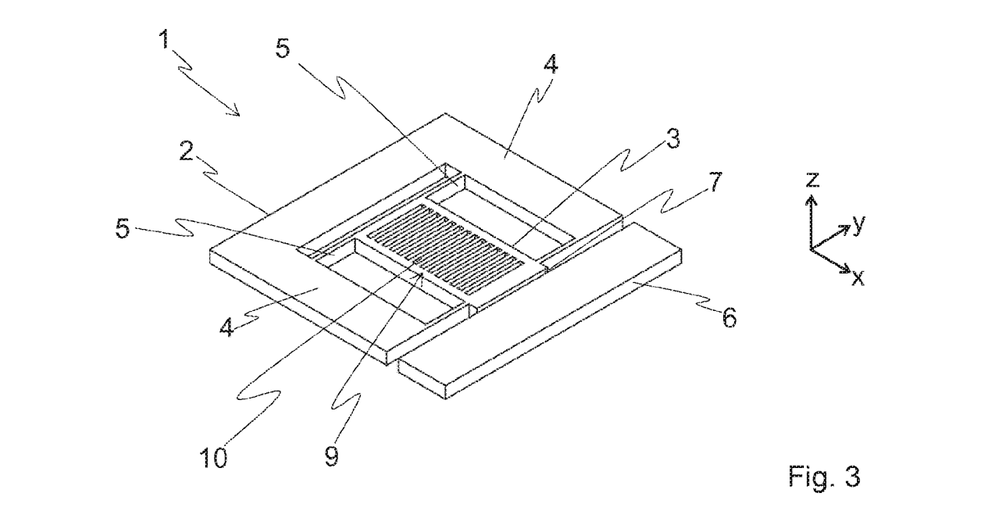
FIG. 3 shows an axonometric view of the micromechanical structure from FIG. 2

The first force component $F_x$ resulting at a given first field-strength component $E_x$ may be strengthened or amplified by means of an amplifying element 6 of the micromechanical structure 1, such as exhibited by the micromechanical structure 1, shown in FIG. 2 and FIG. 3, of a second embodiment of the device according to the invention. The amplifying element 6, viewed in the first direction x, is disposed behind the movable portion 3. Once again, a gap 7 is disposed between the movable portion 3 and the amplifying element 6. In the shown exemplary embodiment, this has a gap width 8, measured in the first direction x, in the range of 10 µm to 50 µm.

The amplifying element 6 is likewise polarized by the electric field E or by the first field-strength component $E_x$, which in FIG. 2 is again indicated by "+" and "−". The charge carriers are not able to drain from this amplifying element 6 to the frame portion 2 or even to the movable portion 3. Therefore, in the region of the gap 7, the movable portion 3 has a polarization exactly opposite to that of the amplifying element 6 in the region of the gap 7. Correspondingly, the movable portion 3 is strongly attracted toward the amplifying element 6 or the amplifying element 6 causes an amplification of the first force component F.

The deflection/change of arrangement of the movable portion 3 can be observed with detecting means and then the magnitude of the first field-strength component $E_x$ can be deduced.

In the shown exemplary embodiments, the detection of the deflection/change of arrangement of the movable portion 3 takes place optically, in order to avoid a distortion of the electric field E as much as possible. In order to increase the measurement accuracy in the process, the movable portion 3 has an aperture structure 9, which consists of a row of rectangular holes 10, wherein the sides of the rectangles extend parallel to the directions x, y. The holes 10 are equally large and are disposed in series in the first direction x. Each hole 10 has a substantially smaller extent in the first direction x than in the second direction y.

Theoretically, the modulation, generated by the aperture structure 9, of a light incident along the third direction z on the movable portion 3 can be used for measurement of the deflection/change of arrangement of the movable portion 3. In the shown exemplary embodiments, however, a fixed aperture structure 11 disposed above the movable portion 3 is additionally provided, which structure is matched to the aperture structure 9. FIG. 5 shows the fixed aperture structure 11 for the second exemplary embodiment of the device according to the invention. This structure consists of rectangular metal strips 14, and the metal strips 14 match the holes 10 in number and size. In the shown exemplary embodiments, the fixed aperture structure 11 is formed by a metal layer 13 on an underside of a glass wafer 12 disposed above the micromechanical structure 1; see FIG. 4. The glass wafer 12 and thus the fixed aperture structure 11 are spatially fixed relative to the frame portion 2.

Figure 6:
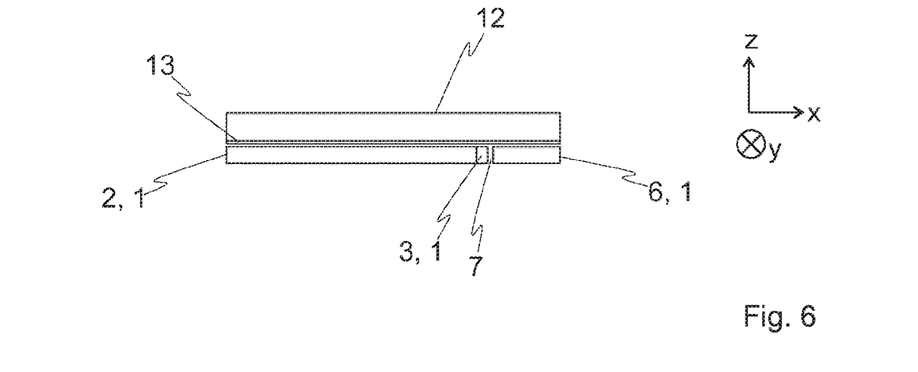
FIG. 6 shows the micromechanical structure of the second embodiment of the device according to the invention with glass wafer disposed above it in side view

FIG. 6 shows a side view along the second direction y, from which the sequence of movable portion 3, metal layer 13 (and thus fixed aperture structure 11) and glass wafer 12 along the third direction z is evident.

Figure 4:
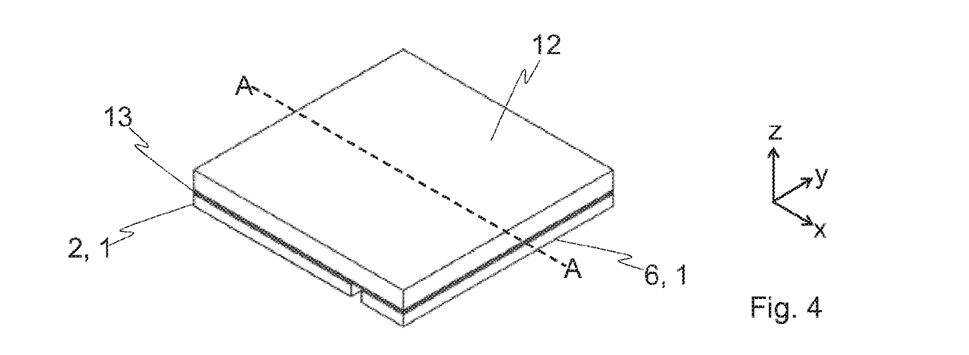
FIG. 4 shows a diagram analogous to FIG. 3, wherein a glass wafer having a structured metal layer applied on its underside is disposed above the micromechanical structure
Figure 5:
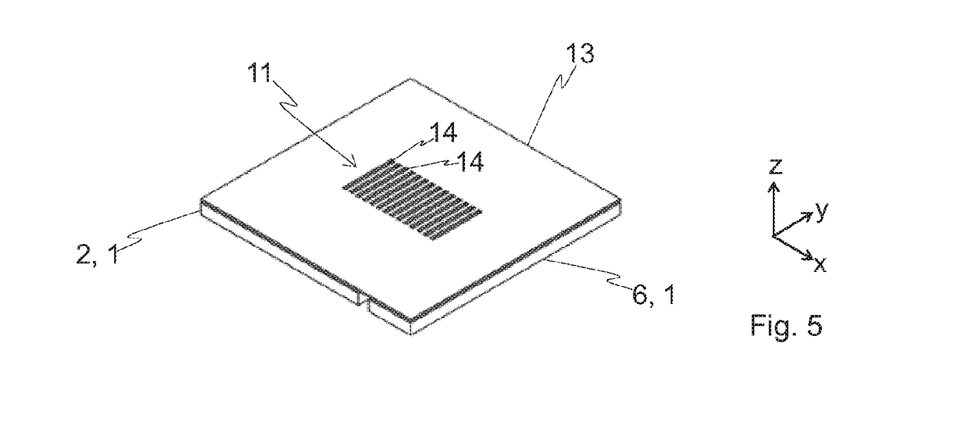
FIG. 5 shows a diagram analogous to FIG. 4, wherein, for reasons of clarity, the glass wafer is masked out and only the metal layer is illustrated
Figure 7:
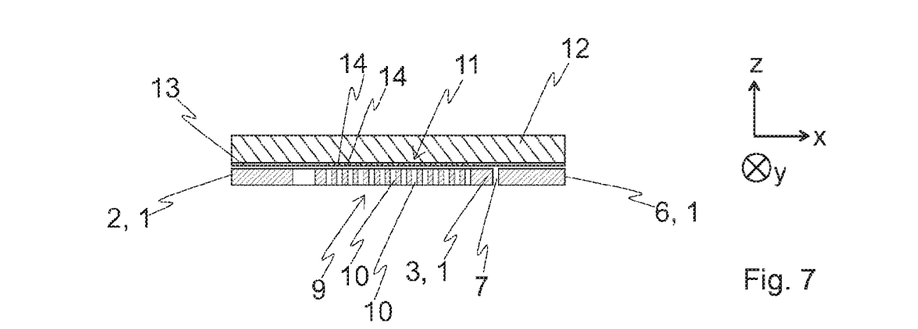
FIG. 7 shows a sectional view according to a section line A-A in FIG. 4, wherein the viewing direction is a second direction

FIG. 7 shows a corresponding sectional view along the second direction y, wherein the section plane passes through the dashed line A-A in FIG. 4. The sectional view reveals not only the aperture structure 9 with the holes 10 but also the metal strips 14 of the fixed aperture structure 11 disposed above the holes 10.

Figure 8:
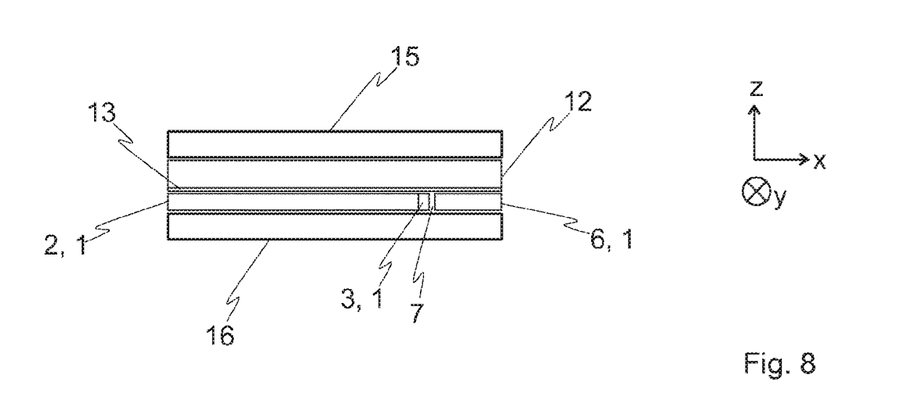
FIG. 8 shows a diagram analogous to FIG. 6, wherein a light-emitting diode disposed above the glass wafer as well as a photodiode disposed under the micromechanical structure are additionally depicted

FIG. 8 shows a side view along the second direction y, wherein a light-emitting diode 15 as the light-supplying means and a photodiode 16 as the optical sensor are illustrated as the detecting means. The resulting very compact construction of the device according to the invention is immediately obvious.

The light-emitting diode 15 functions to supply light along the third direction z of the fixed aperture 11 and the movable portion 3, lying under it, with the aperture structure 9. The photodiode 16 detects the intensity of the light transmitted by the aperture structures 9, 11. On the basis of the geometric design or matching of the aperture structures 9, 11, the smallest deflections/changes of arrangement of the movable portion 3 result in significant, easily detectable intensity changes, which permits an inexpensive manufacture of the device according to the invention.

Figure 9:
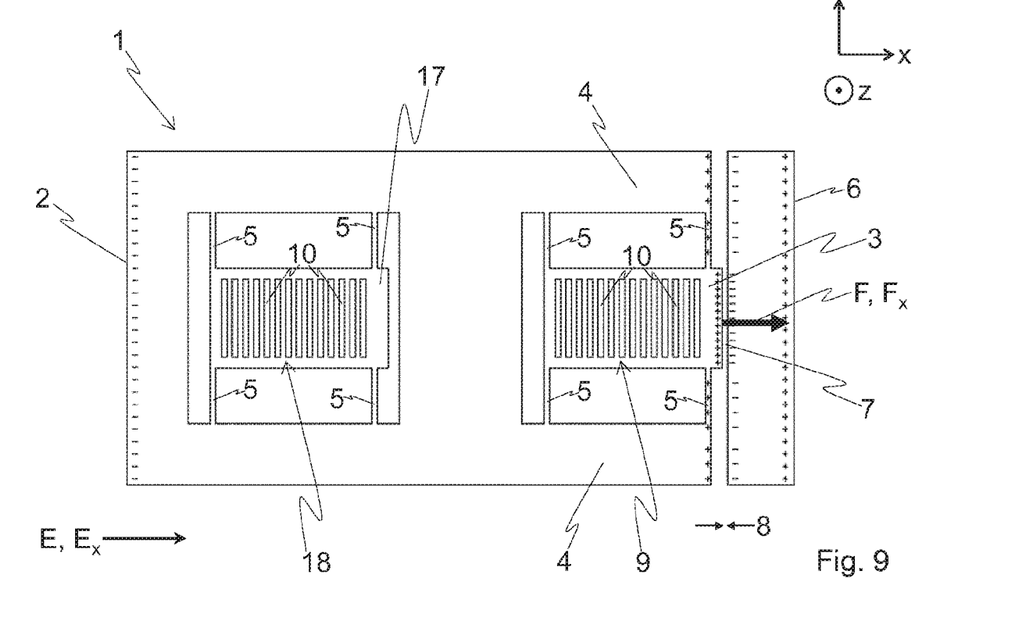
FIG. 9 shows the micromechanical structure of a third embodiment of the device according to the invention in overhead view, wherein a further movable portion is provided by comparison with the second embodiment

FIG. 9 shows the micromechanical structure 1 of a third embodiment of the device according to the invention. In this case, a further movable portion 17 is provided, which in principle is constructed in completely the same way as the movable portion 3 and just as this is connected via webs 5 (four in the shown example) with the frame portion 2, so that the further movable portion 17 is movable relative to the frame portion 2. In other words, the further movable portion 17, just as the movable portion 3, is connected electrically with the frame portion 2 and coupled to it in mechanically elastic manner, wherein the ratio of the strengths of the mechanical coupling is 1:1. Consequently, vibrations of the micromechanical structure 1, which vibrations typically act exclusively in translational manner, cause equally large deflections/changes of arrangement of the movable portion 3 and of the further movable portion 17.

In contrast to the movable portion 3, however, the further movable portion 17, viewed in the first direction x, is disposed in front of the movable portion 3. In particular, the amplifying element 6 is very far removed from the further movable portion 17. The polarization of the micromechanical structure 1 developed in the electric field E with the first field-strength component $E_x$ therefore causes a further first force component that acts on the further movable portion 17 but is smaller by at least one order of magnitude in comparison with the first force component $F_x$, which acts on the movable portion 3. In the shown exemplary embodiment, the further first force component is so small that it is not even indicated.

A deflection/change of arrangement of the further movable portion 17 is therefore generated primarily by the vibrations. Since this deflection is determined and subtracted from the determined/detected deflection of the movable portion 3, that component of the determined/detected deflection of the movable portion 3 which is due to the electric field E or to the first field-strength component $E_x$ can be deduced directly.

For determination/detection of the deflection/change of arrangement of the further movable portion 17, further detecting means are used, which may be substantially the same detecting means as for the determination/detection of the deflection/change of arrangement of the movable portion 3, and so at this place there is no need to go into detail about the further detecting means, but instead reference is made to the above explanations concerning the detecting means. However, it should be pointed out that, as follows from FIG. 9, the further movable portion 17 has a further aperture structure 18, which in the shown example is constructed in exactly the same way as the aperture structure 9. Correspondingly, a further fixed aperture structure (not illustrated) can also be provided in the metal layer 13 on the underside of the glass wafer 12, which covers both portions 3, 17.

Furthermore, the portions 3, 17 (or the fixed aperture structure 11, the further fixed aperture structure as well as the aperture structures 9, 18 lying under it) may be illuminated with the same light-emitting diode 15.

The transmitted light may be detected by two optical sensors/photodiodes (not illustrated) or by an optical sensor, which is disposed under the portions 3, 17 and spatially resolves the two portions 3, 17. In other words, one sensor having two pixels is sufficient, wherein one pixel is disposed under the movable portion 3 and one pixel under the further movable portion 17.

Figure 10:
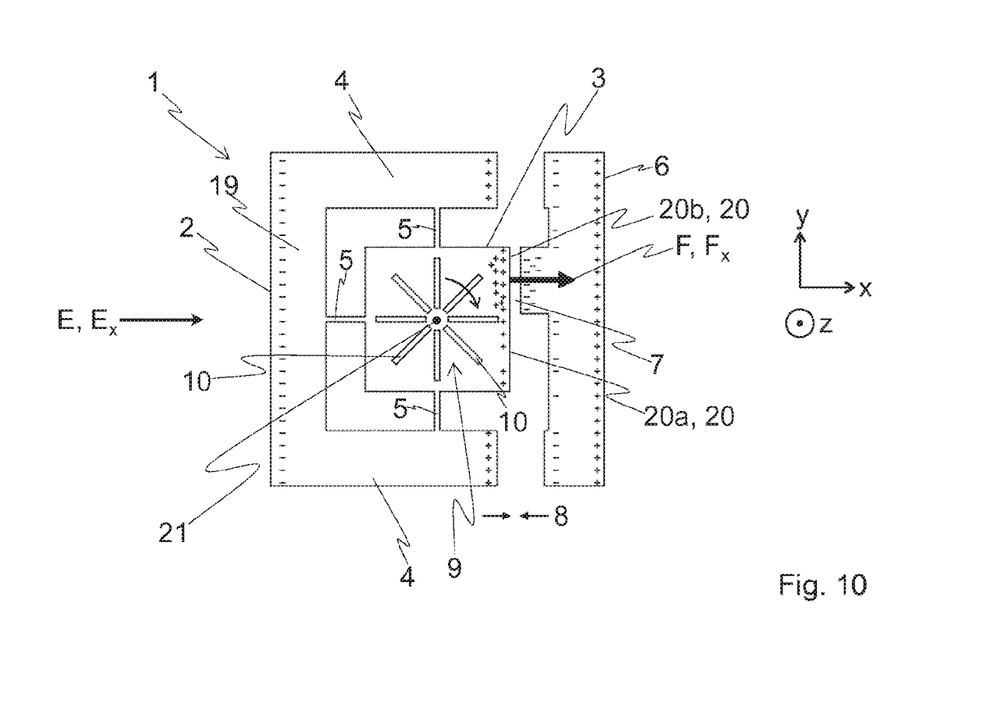
FIG. 10 shows the micromechanical structure of a fourth embodiment of the device according to the invention in overhead view, wherein an electric field causes a rotation of the movable portion

In FIG. 10, the micromechanical structure 1 of a fourth embodiment of the device according to the invention is illustrated, which likewise permits the unambiguous measurement of the electric field E or of the first field-strength component $E_x$ in the presence of vibrations. This utilizes the fact that vibrations typically act in purely translational manner. The micromechanical structure 1 is now designed such that the change, generated by the first field-strength component $E_x$, of the spatial arrangement of the movable portion 3 relative to the frame portion 2 is a rotation of the movable portion 3 relative to the frame portion 2—in the shown example around an axis of rotation parallel to the third direction z. Since the rotary change of arrangement is determined selectively, the first field-strength component $E_x$ can be deduced directly.

For this purpose, the movable portion 3 is again disposed in the U-shaped frame portion 2, wherein the movable portion 3 has a substantially square outline with sides in the plane xy. The movable portion is connected via three webs 5 not only with the limbs 4 but also with a transverse beam 19, connecting the limbs 4, of the frame portion 2. These webs 5 are respectively disposed centrally relative to the sides of the movable portion 3. One side 20 of the movable portion 3 that is not connected with the frame portion 2 projects beyond the frame portion 2 in the first direction x.

The side 20 extends parallel to the second direction y and, viewed in the second direction y, has a first half 20a and a following second half 20b.

Viewed in the first direction x, the amplifying element 6 is disposed behind the side 20, but in contrast to the exemplary embodiment of FIG. 2 it is specially shaped. This shape is such that the amplifying element 6 comes close to the side 20 only in the region of the second half 20b. In other words, gap 7 with the gap width 8 is present only in the region of the second half 20b. Correspondingly, an amplified first force component Fx is generated by the amplifying element 6 only in the region of the second half 20b, or this amplified force component Fx acts on the movable portion 3 only in the region of the second half 20b but not in the region of the first half 20a. The consequence is a rotation of the movable portion around an axis of rotation 21, which lies at the center of the movable portion 3 relative to the plan xy, which rotation is indicated in FIG. 10 by the curved arrow. The axis of rotation 21 is oriented normal to the plane xy.

In order to be able selectively to detect the rotary and not the translational component of the deflection/change of arrangement of the movable portion 3, the aperture structure 9 is correspondingly adapted. Specifically, for this purpose, the aperture structure 9 again has a multiplicity of rectangular holes 10, although these are disposed in star-like manner around the center of the movable portion 3 relative to the plane xy or around the axis of rotation 21. In other words, the rectangular holes 10 are disposed around the axis of rotation 21 and with their longer sides pointing radially outward.

Figure 11:
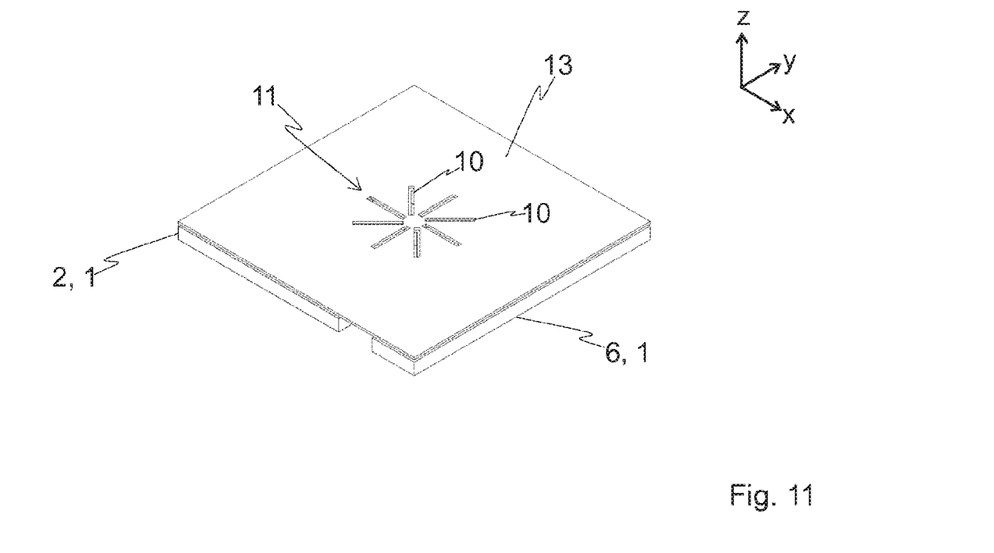
FIG. 11 shows the micromechanical structure from FIG. 10 in a diagram analogous to FIG. 5, in which the metal layer applied on the underside of the glass wafer is depicted but for reasons of clarity the glass wafer itself is not

The fixed aperture structure 11 is also adapted correspondingly; see FIG. 11. Once again, the aperture structure 11 is formed by the metal layer 13, although now it consists of rectangular holes 10 in the metal layer, which holes are just as large and oriented in just the same way as the rectangular holes 10 of the aperture structure 9.

The other construction with light-emitting diode 15 and photodiode 16 corresponds to that shown in FIG. 8. If light is now transmitted from the light-emitting diode 15 through the aperture structures 11 and 9, the intensity of the transmitted light detected by the photodiode 16 depends substantially more strongly on the rotary arrangement of the aperture structures 11 and 9 relative to one another than on their translational arrangement relative to one another. Thus translational deflections/changes of arrangement are negligible for these intensity measurements, and the measured intensity change is substantially a measure of the rotary deflection/change of arrangement of the movable portion 3 relative to the frame portion 2. Correspondingly, even in the presence of vibrations, it is possible to deduce the electric field E or the first field-strength component $E_x$ reliably and with high accuracy.

Figure 12:
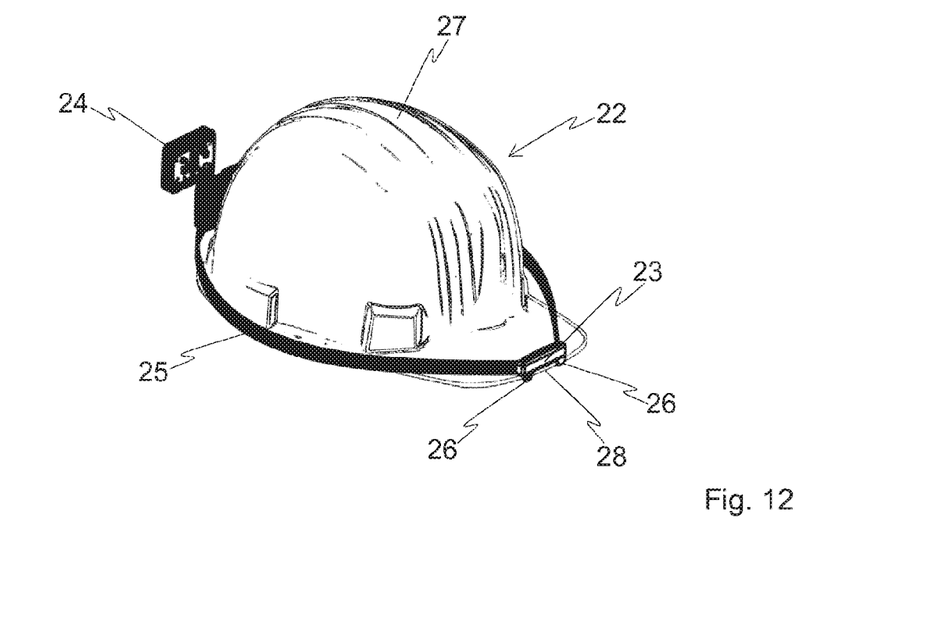
FIG. 12 shows a safety helmet according to the invention as an example of application for the device according to the invention

FIG. 12 shows a safety helmet 22 according to the invention as an example of application for the device according to the invention. The safety helmet 22 serves for warning a worker about live components. In the illustrated exemplary embodiment, the device according to the invention is not integrated in fixed manner in the safety helmet 22, but instead is set up for mounting on a conventional helmet 27, in order to create the safety helmet 22 according to the invention by means of the conventional helmet 27 in simple manner. This has the advantage that any arbitrary helmet 27 may be used in principle and that the helmet 27 may be exchanged as needed.

In the shown exemplary embodiment, the micromechanical structure 1 is disposed in a sensor module 23. The sensor module 23 is adapted to the shape of the helmet 27, in the sense that the sensor module 23 is provided with hooks 26, which are used for engagement around a rim 28 of the helmet 27. As illustrated in FIG. 12, these hooks 26 are or this sensor module 23 is disposed in a front portion of the helmet 27, i.e. in a region located close to the forehead of a user during the wearing of the helmet 27.

The sensor module 23 is connected via an elastic band 25 with an optoelectronic module 24, wherein, for fastening on the helmet 27, the sensor module 23 together with the optoelectronic module 24 and the band 25 can be folded or stretched over it. The band 25 is provided with light-supplying means and light-guiding means in the form of glass fibers. By means of at least one glass fiber as the light-supplying means, light generated in the optoelectronic module 24, for example by means of a light-emitting or laser diode, not additionally illustrated, can be supplied to the micromechanical structure 1 on one side.

At least one glass fiber of the band 25, as a light-guiding means, is part of an optical sensor, which in the illustrated exemplary embodiment further comprises a photodiode (not illustrated) disposed in the optoelectronic module 24. Light on the opposite side of the micromechanical structure 1 is captured with this at least one glass fiber and supplied to the photodiode.

The optoelectronic module 24 further comprises a corresponding evaluating electronic unit. Upon detection of an electric field that may be hazardous for the worker or user, the optoelectronic module 24 emits optical and/or acoustic warning signals, in order to warn the worker or user.

LIST OF REFERENCE SYMBOLS

1 Micromechanical structure
2 Frame portion
3 Movable portion
4 Limb
5 Web
6 Amplifying element
7 Gap
8 Gap width
9 Aperture structure on the movable portion
10 Rectangular hole
11 Fixed aperture structure
12 Glass wafer
13 Metal layer
14 Metal strip
15 Light-emitting diode
16 Photodiode
17 Further movable portion
18 Further aperture structure on the further movable portion
19 Transverse beam
20 Non-connected side of the movable portion
20a First half of the side 20
20b Second half of the side 20
21 Axis of rotation
22 Safety helmet
23 Sensor module
24 Optoelectronic module
25 Band having at least one integrated glass fiber
26 Hook
27 Helmet
28 Rim of the helmet
x First direction
y Second direction
z Third direction
xy Plane, parallel to the first and second direction
E Electric field $E_x$ First field-strength component of the electric field parallel to the first direction
F Force
$F_x$ First force component parallel to the first direction

The invention claimed is:

1. A device for measurement of an electric field, the device comprising a micromechanical structure, which extends in a first direction, a second direction and a third direction;
   wherein the first direction, the second direction and the third direction are mutually normal to one another;
   wherein the micromechanical structure is made from a material that is electrically conducting at an operating temperature and has a frame portion as well as a movable portion;
   wherein the movable portion is connected in electrically conducting and mechanically elastic manner with the frame portion and is movable relative to the frame portion;
   wherein the micromechanical structure is so designed that, in the case of an arrangement of the micromechanical structure in the electric field with a non-zero first field-strength component parallel to the first direction, an electrical polarization of the micromechanical structure takes place, which results in a first force component acting on the movable portion parallel to the first direction as well as a change, dependent on the first force component, of the spatial arrangement of the movable portion relative to the frame portion; and
   wherein detecting means are provided in order to determine the change of the spatial arrangement of the movable portion relative to the frame portion.

2. The device according to claim 1, wherein the frame portion and the movable portion are constructed in one piece.

3. The device according to claim 1,
   wherein the frame portion is formed at least partially with substantially a U-shape in a plane that is parallel to the first direction and the second direction;
   wherein parallel limbs of the U-shape extend parallel to the first direction;
   wherein the movable portion is disposed between the limbs; and
   wherein the movable portion is connected with the limbs via webs.

4. The device according to claim 3, wherein the webs extend parallel to the second direction.

5. The device according to claim 1,
   wherein the micromechanical structure comprises an amplifying element that is electrically separate from the frame portion and from the movable portion and that, viewed in the first direction, is disposed behind the movable portion; and
   wherein a gap is disposed between the movable portion and the amplifying element.

6. The device according to claim 5, wherein the gap has a gap width, measured in the first direction, of smaller than or equal to 500 µm.

7. The device according to claim 6, wherein the gap width is smaller than or equal to 200 µm.

8. The device according to claim 6, wherein the gap width lies in the range of 0.1 µm to 50 µm.

9. The device according to claim 1, wherein the detecting means comprise an optical sensor as well as at least one light-supplying means.

10. The device according to claim 9, wherein the movable portion is disposed between the at least one light-supplying means and the optical sensor.

11. The device according to claim 10,
    wherein the at least one light-supplying means comprises a light guide, in order to illuminate one side of the micromechanical structure at least partly with light guided by the light guide; and
    wherein the optical sensor comprises a further light guide, in order to capture the light on an opposite side of the micromechanical structure.

12. The device according to claim 1,
    wherein the detecting means comprise an aperture structure on the movable portion as well as a fixed aperture structure; and
    wherein the fixed aperture structure has a fixed spatial arrangement relative to the frame portion.

13. The device according to claim 12, wherein the fixed aperture structure is formed in a metal layer on a glass wafer.

14. The device according to claim 12, wherein the detecting means comprise an optical sensor as well as at least one light-supplying means;
    wherein the movable portion is disposed between the at least one light-supplying means and the optical sensor; and
    wherein the fixed aperture structure is disposed between the movable portion, and the at least one light-supplying means or the optical sensor.

15. The device according to claim 14, wherein the fixed aperture structure is disposed between the aperture structure on the movable portion and the at least one light-supplying means or the optical sensor.

16. The device according to claim 1, wherein the micromechanical structure is so designed that the change of the spatial arrangement of the movable portion relative to the frame portion comprises a rotation of the movable portion relative to the frame portion.

17. The device according to claim 16, wherein the micromechanical structure is so designed that the change of the spatial arrangement of the movable portion relative to the frame portion comprises a rotation of the movable portion relative to the frame portion around an axis of rotation parallel to the third direction.

18. The device according to claim 1,
    wherein the micromechanical structure comprises a further movable portion, which is connected in electrically conducting and mechanically elastic manner with the frame portion;
    wherein the strength of the mechanical coupling of the further movable portion to the frame portion is in a given known ratio to the strength of the mechanical coupling of the movable portion to the frame portion;
    wherein the micromechanical structure is so designed that, in the case of an arrangement of the micromechanical structure in the electric field with the non-zero first field-strength component, the electrical polarization of the micromechanical structure takes place, which results in a further first force component acting on the further movable portion parallel to the first direction (x) as well as a change, dependent on the further first force component, of the spatial arrangement of the further movable portion relative to the frame portion;
    wherein the further first force component and/or the change of the spatial arrangement of the further movable portion is smaller by a factor smaller than or equal to 0.1 than the first force component and/or the change of the spatial arrangement of the movable portion generated by the first force component; and wherein further detecting means are provided in order to determine the change of the spatial arrangement of the further movable portion relative to the frame portion.

19. The device according to claim 18,
wherein the further detecting means comprise a further aperture structure on the further movable portion as well as a further fixed aperture structure; and
wherein the further fixed aperture structure has a fixed spatial arrangement relative to the frame portion.

20. The device according to claim 19,
wherein the detecting means comprise an aperture structure on the movable portion as well as a fixed aperture structure;
wherein the fixed aperture structure has a fixed spatial arrangement relative to the frame portion;
wherein the fixed aperture structure is formed in a metal layer on a glass wafer; and
wherein the further fixed aperture structure is formed in the metal layer on the glass wafer.

21. The device according to claim 18, wherein the further detecting means comprise a further optical sensor as well as at least one further light-supplying means.

22. The device according to claim 21,
wherein the detecting means comprise an optical sensor as well as at least one light-supplying means;
wherein the movable portion is disposed between the at least one light-supplying means and the optical sensor;
wherein the further optical sensor is formed by the optical sensor and the at least one further light-supplying means is formed by the at least one light-supplying means; and
wherein the further movable portion is disposed between the at least one light-supplying means and the optical sensor.

23. The device according to claim 18, wherein the strength of the mechanical coupling of the further movable portion to the frame portion is in the ratio 1:1 to the strength of the mechanical coupling of the movable portion to the frame portion.

24. The device according to claim 18, wherein the further first force component and/or the change of the spatial arrangement of the further movable portion is smaller by a factor smaller than or equal to 0.01 than the first force component and/or the change of the spatial arrangement of the movable portion generated by the first force component.

* * * * *